United States Patent
Song

(10) Patent No.: US 10,404,241 B2
(45) Date of Patent: Sep. 3, 2019

(54) ELECTRONIC DEVICE

(71) Applicant: SK hynix Inc., Gyeonggi-do (KR)

(72) Inventor: Jeong-Eun Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 26 days.

(21) Appl. No.: 15/704,641

(22) Filed: Sep. 14, 2017

(65) Prior Publication Data

US 2018/0219537 A1    Aug. 2, 2018

(30) Foreign Application Priority Data

Jan. 31, 2017  (KR) .................. 10-2017-0013913

(51) Int. Cl.
| | |
|---|---|
| *H03K 5/12* | (2006.01) |
| *H03K 5/01* | (2006.01) |
| *H03K 4/00* | (2006.01) |
| *H03K 4/48* | (2006.01) |
| *H04N 5/378* | (2011.01) |
| *H03M 1/12* | (2006.01) |

(52) U.S. Cl.
CPC .................. *H03K 5/01* (2013.01); *H03K 4/00* (2013.01); *H03K 4/48* (2013.01); *H03M 1/12* (2013.01); *H04N 5/378* (2013.01)

(58) Field of Classification Search
CPC ....................................................... H03K 5/12
USPC ....................................................... 327/170
See application file for complete search history.

(56) References Cited

U.S. PATENT DOCUMENTS

| | | | |
|---|---|---|---|
| 2009/0033759 A1* | 2/2009 | Wakabayashi | H04N 5/335 348/222.1 |
| 2011/0114827 A1* | 5/2011 | Yamaoka | H03K 4/026 250/214 R |
| 2014/0166856 A1* | 6/2014 | Kato | H03M 1/0607 250/208.1 |
| 2018/0123572 A1 | 5/2018 | Song | |

FOREIGN PATENT DOCUMENTS

| | | |
|---|---|---|
| KR | 100466074 | 1/2005 |
| KR | 100736364 | 7/2007 |

* cited by examiner

*Primary Examiner* — Metasebia T Retebo
(74) *Attorney, Agent, or Firm* — IP & T Group LLP

(57) ABSTRACT

An electronic device may include a ramp signal generator suitable for generating a ramp signal having a slope corresponding to an analog gain, and a slope correction circuit suitable for correcting the slope based on a correction code signal.

16 Claims, 8 Drawing Sheets

ELECTRONIC DEVICE

CROSS-REFERENCE TO RELATED APPLICATION

This application claims priority under 35 U.S.C. § 119 to Korean Patent Application No. 10-2017-0013913 filed on Jan. 31, 2017 in the Korean Intellectual Property Office, the disclosure of which is incorporated herein by reference in its entirety.

TECHNICAL FIELD

Exemplary embodiments of the present disclosure relate to a semiconductor design technology and, more particularly, to an electronic device.

DISCUSSION OF THE RELATED ART

An electronic device may include an analog-to-digital converter (ADC) for converting an analog signal to a digital signal.

For example, an image sensing device may include the ADC for converting an analog pixel signal to a digital signal. The ADC may compare the pixel signal with a ramp signal and generate the digital signal corresponding to the result of the comparison. The ramp signal is used as a comparison signal for determining a voltage level of the pixel signal, and may be constantly adjusted in voltage level per unit time within a predetermined range.

An image sensing device may adjust an analog gain by adjusting the slope of the ramp signal. The analog gain is a parameter pertaining to ambient illuminance conditions.

The image sensing device may capture images using photosensitive properties of semiconductors. The image sensing device may be classified into charge-coupled device (CCD) or complementary metal-oxide semiconductor (CMOS) image sensors. CMOS image sensors allow both analog and digital control circuits to be directly realized on a single integrated circuit (IC), making them the most widely used type of image sensors.

SUMMARY

Various embodiments are directed to an electronic device generating a ramp signal having a slop that is adjusted depending on an analog gain, wherein the linearity of the analog gain is maintained constant.

In an embodiment, an electronic device may include: a ramp signal generator suitable for generating a ramp signal having a slope corresponding to an analog gain; and a slope correction circuit suitable for correcting the slope based on a correction code signal.

The ramp signal generator may be coupled between a first voltage terminal and a second voltage terminal, and the slope correction circuit may correct, based on a correction code signal, the slope changed by a parasitic resistance formed between the ramp signal generator and the first voltage terminal or between the ramp signal generator and the second voltage terminal.

The slope correction circuit may reduce the slope when the parasitic resistance has a positive value, and increase the slope when the parasitic resistance has a negative value.

The correction code signal may be preset corresponding to the analog gain.

The ramp signal generator may adjust the slope according to the analog gain based on a ramp code signal and a gain code signal.

The ramp signal generator may adjust the slope by adjusting a resistance value to be reflected in an output terminal of the ramp signal, and the slope correction circuit may correct the slope by reflecting a predetermined resistance value in the output terminal of the ramp signal.

The ramp signal generator may adjust the slope by adjusting a voltage level of a bias signal needed when the ramp signal is generated, and the slope correction circuit may correct the slope by generating a correction current on an output terminal of the bias signal.

In an embodiment, an electronic device may include: a ramp current generation circuit suitable for generating a ramp current corresponding to a ramp signal on an output terminal of the ramp signal; a slope adjustment circuit suitable for adjusting a slope of the ramp signal according to an analog gain; and a slope correction circuit suitable for correcting the slope of the ramp signal based on a correction code signal.

The slope adjustment circuit may be coupled between the output terminal of the ramp signal and a low-voltage terminal, and the slope correction circuit may correct, based on a correction code signal, the slope of the ramp signal changed by a parasitic resistance formed between the slope adjustment circuit and the low-voltage terminal.

The slope correction circuit may reduce the slope when the parasitic resistance has a positive value, and increase the slope when the parasitic resistance has a negative value.

The correction code signal may be preset corresponding to the analog gain.

The slope correction circuit may include a plurality of resistance value reflection units coupled in parallel between the output terminal of the ramp signal and the low-voltage terminal, and the plurality of resistance value reflection units may reflect a resistance value corresponding to the parasitic resistance in the output terminal of the ramp signal, based on the correction code signal.

The ramp current generation circuit may include: a bias signal generation unit coupled between a high-voltage terminal and a low-voltage terminal, and configured to generate a bias signal corresponding to a reference current; and a plurality of mirroring units coupled in parallel between the high-voltage terminal and the output terminal of the ramp signal, and configured to generate the ramp current by mirroring the reference current, based on the bias signal and a ramp code signal.

The slope adjustment circuit may include a plurality of resistance value reflection units coupled in parallel between the output terminal of the ramp signal and a low-voltage terminal, and the plurality of resistance value reflection units may reflect a resistance value corresponding to the analog gain in the output terminal of the ramp signal, based on a gain code signal.

In an embodiment, an electronic device may include: a bias signal generation circuit suitable for generating a bias signal corresponding to an analog gain based on a gain code signal; a ramp signal generation circuit suitable for generating a ramp signal, and adjusting a slope of the ramp signal based on the bias signal; and a slope correction circuit suitable for correcting the slope of the ramp signal based on a correction code signal.

Each of the bias signal generation circuit and the ramp signal generation circuit may be coupled between a high-voltage terminal and a low-voltage terminal, wherein the slope correction circuit may correct, based on a correction code signal, the slope of the ramp signal changed by at least one of a first parasitic resistance and a second parasitic resistance, and wherein the first parasitic resistance may be formed between the high-voltage terminal and the bias signal generation circuit, and the second parasitic resistance may be formed between the high-voltage terminal and the ramp signal generation circuit.

The slope correction circuit may reduce the slope when at least one of the first parasitic resistance and the second parasitic resistance has a positive value, and increase the slope when at least one of the first parasitic resistance and the second parasitic resistance has a negative value.

The correction code signal may be preset corresponding to the analog gain.

The slope correction circuit may include a plurality of correction current generation units coupled in parallel between the high-voltage terminal and an output terminal of the bias signal, and the plurality of correction current generation units may generate a correction current corresponding to at least one of the first parasitic resistance and the second parasitic resistance on the output terminal of the bias signal, based on the correction code signal.

The bias signal generation circuit may include: a reference current generation unit coupled between an output terminal of the bias signal and a low-voltage terminal; and a plurality of bias signal generation units coupled in parallel between a high-voltage terminal and the output terminal of the bias signal, and wherein the plurality of bias signal generation units generate a bias current corresponding to the analog gain on the output terminal of the bias signal, based on the gain code signal.

The ramp signal generation circuit may include: a fixed resistance unit coupled between an output terminal of the ramp signal and a low-voltage terminal; and a plurality of ramp current generation units coupled in parallel between a high-voltage terminal and the output terminal of the ramp signal, and wherein the plurality of ramp current generation units generate a ramp current on the output terminal of the ramp signal, based on the bias signal and a ramp code signal, the ramp current being adjusted by a predetermined level per unit time.

DETAILED DESCRIPTION

Figure 1:
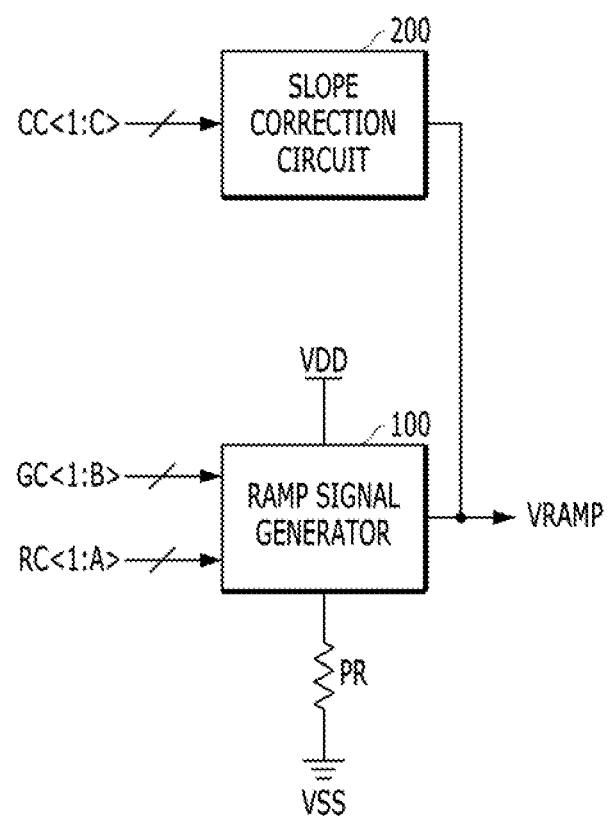
FIG. 1 is a block diagram illustrating an electronic device, in accordance with an embodiment of the present disclosure.

Various embodiments of the present invention will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

The terminology used herein is for the purpose of describing particular embodiments only and is not intended to be limiting of the inventive concept. As used herein, singular forms are intended to include the plural forms as well, unless the context clearly indicates otherwise. It will be further understood that the terms "comprises," "comprising," "includes," and/or "including" when used in this specification, indicate the presence of stated features, but do not preclude the presence or addition of one or more other features. As used herein, the term "and/or" indicates any and all combinations of one or more of the associated listed items.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

FIG. 1 is a block diagram illustrating an electronic device, in accordance with an embodiment of the present disclosure.

Referring to FIG. 1, the electronic device may include a ramp signal generator 100 and a slope correction circuit 200.

The ramp signal generator 100 may generate a ramp signal VRAMP having a slope corresponding to an analog gain based on a ramp code signal RC<1:A> and a gain code signal GC<1:B>. For instance, the ramp signal generator 100 may generate the ramp signal VRAMP, which is decreasing by a voltage level corresponding to the analog gain per unit time.

The ramp signal generator 100 may adjust the slope of the ramp signal VRAMP based on variable resistance. For example, the ramp signal generator 100 may adjust the slope of the ramp signal VRAMP by reflecting a first resistance value corresponding to the analog gain in an output terminal of the ramp signal VRAMP.

The ramp signal generator 100 may undesirably adjust the slope of the ramp signal VRAMP due to an external change or an internal change. For instance, the ramp signal generator 100 may be coupled between a high-voltage terminal VDD and a low-voltage terminal VSS, and undesirably increase or decrease the slope of the ramp signal VRAMP due to a parasitic resistance PR generated between the ramp signal generator 100 and the low-voltage terminal VSS. Here, the parasitic resistance PR may refer to a parasitic resistance which is substantially generated between the ramp signal generator 100 and the low-voltage terminal VSS. Alternatively, the parasitic resistance PR may refer to a parasitic resistance which is simulated as being generated between the ramp signal generator 100 and the low-voltage terminal VSS. The words "the slope of the ramp signal VRAMP has been undesirably adjusted" means that the analog gain has been undesirably adjusted.

The slope correction circuit 200 may correct the slope of the ramp signal VRAMP based on a correction code signal CC<1:C>. For example, the slope correction circuit 200 may directly increase or decrease, based on the correction code signal CC<1:C>, the slope of the ramp signal VRAMP that has been undesirably adjusted by the parasitic resistance PR. The correction code signal CC<1:C> may be preset corresponding to the analog gain (refer to tables 1 and 2 below). The correction code signal CC<1:C> may be generated by an internal circuit (not shown), e.g., a register, or a fuse circuit, of the electronic device, or alternatively generated by an external device (not shown), e.g., a controller.

The slope correction circuit 200 may correct the slope of the ramp signal VRAMP based on the variable resistance. For example, the slope correction circuit 200 may correct the slope of the ramp signal VRAMP by reflecting a second resistance value corresponding to the parasitic resistance PR in the output terminal of the ramp signal VRAMP.

Figure 2:
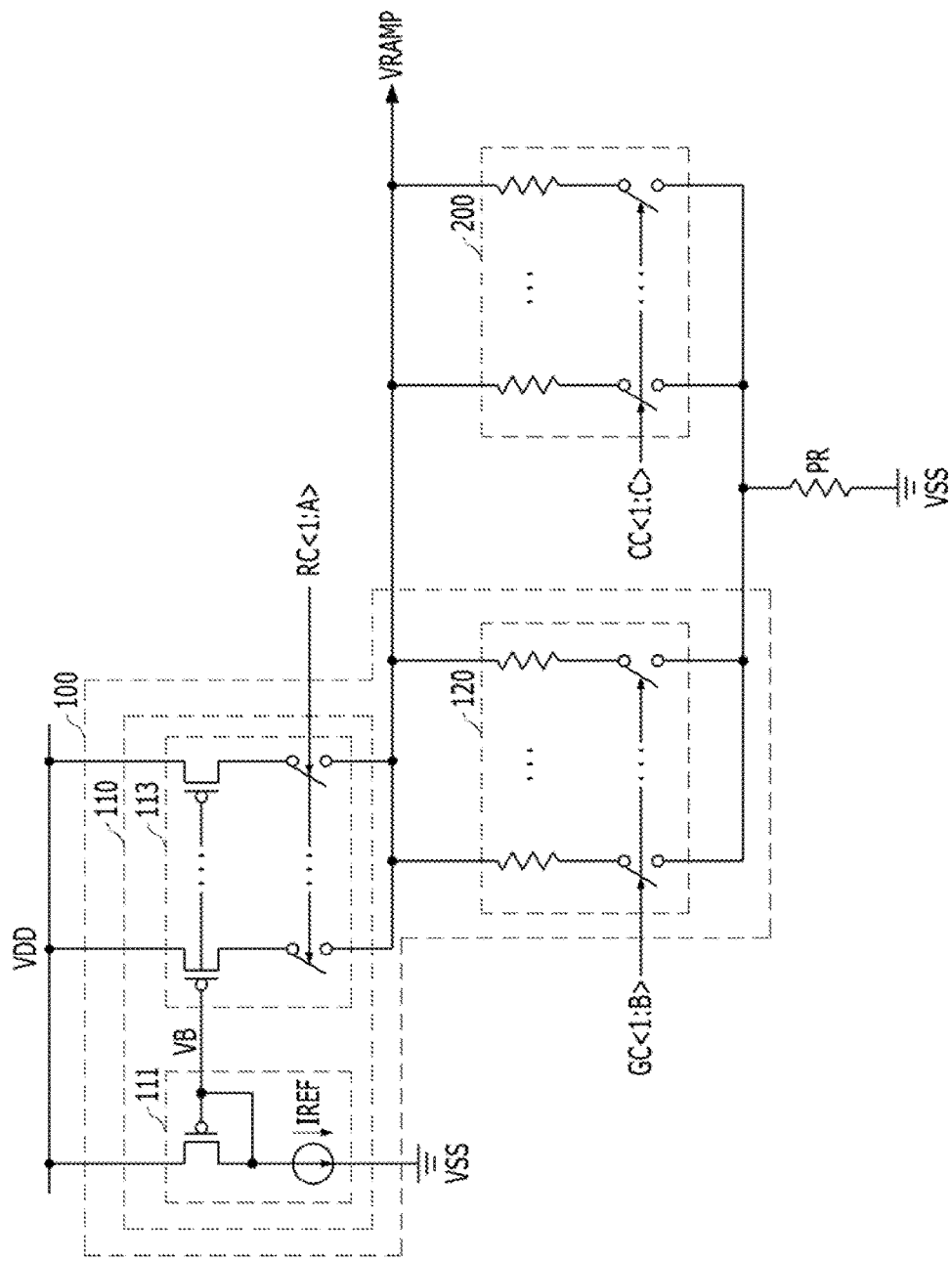
FIG. 2 is a diagram illustrating a ramp signal generator and a slope correction circuit shown in FIG. 1.

FIG. 2 is a diagram illustrating a ramp signal generator and a slope correction circuit in accordance with an embodiment of the present disclosure. For example, in FIG. 2, there is illustrated a circuit diagram of the ramp signal generator 100 and the slope correction circuit 200 shown in FIG. 1.

Referring to FIG. 2, the ramp signal generator 100 may include a fixed-current-based ramp current generation circuit 110 and a variable-resistance-based slope adjustment circuit 120.

The ramp current generation circuit 110 may generate, based on the ramp code signal RC<1:A>, a ramp current corresponding to the ramp signal VRAMP on the output terminal of the ramp signal VRAMP. For instance, the ramp current generation circuit 110 may include a bias signal generation unit 111 and first to A-th mirroring units 113. In some embodiments, "A" may be a natural number of 2 or more.

The bias signal generation unit 111 may generate a bias signal VB having a constant voltage level corresponding to a reference current IREF. For example, the bias signal generation unit 111 may be coupled between the high-voltage terminal VDD and the low-voltage terminal VSS.

The first to A-th mirroring units 113 may generate, based on the bias signal VB and the ramp code signal RC<1:A>, the ramp current which is adjusted by a predetermined level per unit time on the output terminal of the ramp signal VRAMP. For example, the first to A-th mirroring units 113 may be coupled in parallel between the high-voltage terminal VDD and the output terminal of the ramp signal VRAMP, may be successively selected based on first to A-th assignment signals included in the ramp code signal RC<1:A>, and may generate the ramp current by mirroring the reference current IREF based on the bias signal VB.

The slope adjustment circuit 120 may reflect a first resistance value in the output terminal of the ramp signal VRAMP based on the gain code signal GC<1:B>. The slope adjustment circuit 120 may include first to B-th resistance value reflection units (where "B" is a natural number of 2 or more) which are coupled in parallel between the output terminal of the ramp signal VRAMP and the low-voltage terminal VSS.

The first to B-th resistance value reflection units may be individually controlled based on first to B-th assignment signals included in the gain code signal GC<1:B>. The first to B-th resistance value reflection units may reflect the first resistance value in the output terminal of the ramp signal VRAMP according to combination of the first to B-th assignment signals. The resistance values of resistances included in the first to B-th resistance value reflection units may be the same or differ from each other.

The slope correction circuit 200 may reflect a second resistance value in the output terminal of the ramp signal VRAMP based on the correction code signal CC<1:C>. For example, the slope correction circuit 200 may include first to C-th resistance value reflection units (where "C" is a natural number of 1 or more) which are coupled in parallel between the output terminal of the ramp signal VRAMP and the low-voltage terminal VSS.

The first to C-th resistance value reflection units may be individually controlled based on first to C-th assignment signals included in the correction code signal CC<1:C>. The first to C-th resistance value reflection units may reflect the second resistance value in the output terminal of the ramp signal VRAMP according to combination of the first to C-th assignment signals. The resistance values of resistances included in the first to C-th resistance value reflection units may be the same or differ from each other.

Hereinafter, the operation of the electronic device shown in FIGS. 1 and 2 in accordance with the embodiment of the present disclosure having the above-mentioned configuration will be described.

First, there will be described the operation of the electronic device in the case where the parasitic resistance PR has a positive resistance value. Here, there will be described an example in which the slope adjustment circuit 120, the slope correction circuit 200 and the parasitic resistance PR included in the electronic device are designed or formed in a manner shown in FIG. 3.

Figure 3:
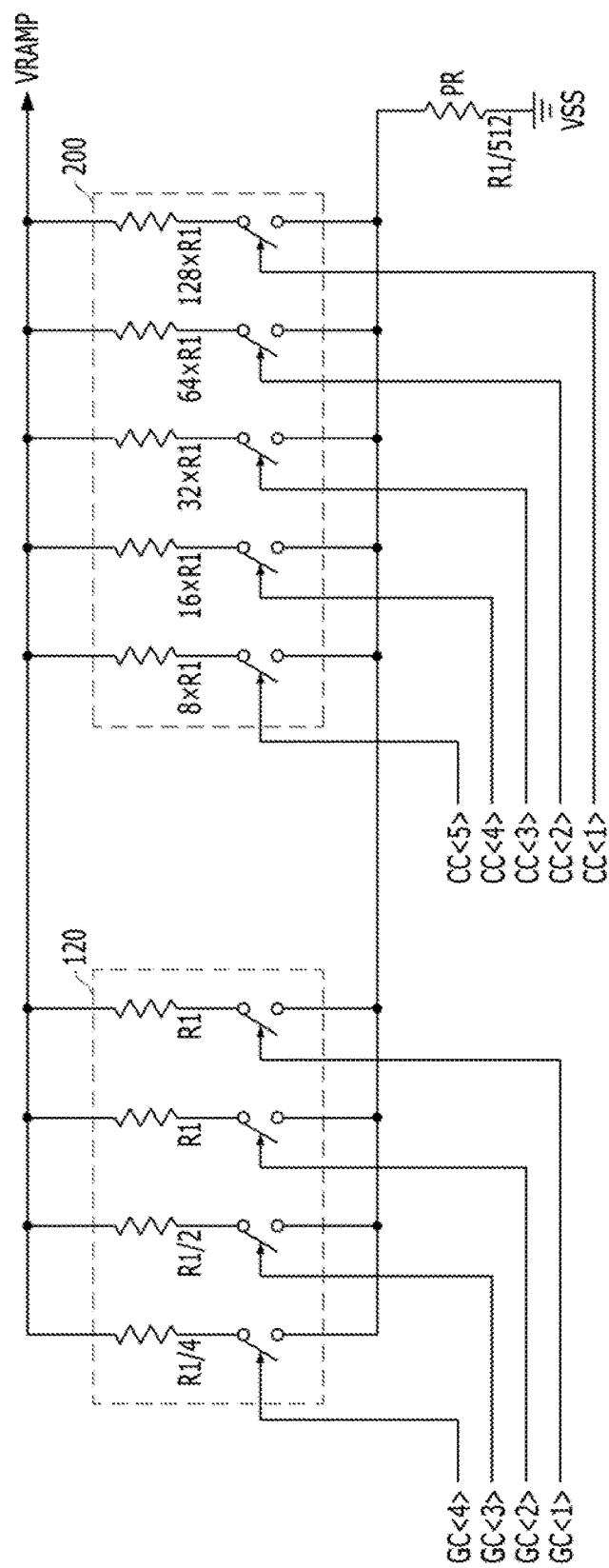
FIG. 3 is a circuit diagram illustrating a slope adjustment circuit, a slope correction circuit, and a parasitic resistance shown in FIG. 2.

FIG. 3 is a circuit diagram illustrating a slope adjustment circuit, a slope correction circuit and a parasitic resistance in accordance with an embodiment of the present disclosure. For example, in FIG. 3, there is illustrated a circuit diagram showing an embodiment of the slope adjustment circuit 120, the slope correction circuit 200 and the parasitic resistance PR shown in FIG. 2.

Referring to FIG. 3, the slope adjustment circuit 120 may include first to fourth resistance value reflection units. The first to fourth resistance value reflection units may reflect the first resistance value in the output terminal of the ramp signal VRAMP based on first to fourth gain assignment signals GC<1> to GC<4> included in the gain code signal GC<1:4>. For instance, the first resistance value reflection unit may reflect, based on the first gain assignment signal GC<1>, a resistance value corresponding to "R1" in the output terminal of the ramp signal VRAMP. The second resistance value reflection unit may reflect, based on the second gain assignment signal GC<2>, a resistance value corresponding to "R1" in the output terminal of the ramp signal VRAMP. The third resistance value reflection unit may reflect, based on the third gain assignment signal GC<3>, a resistance value corresponding to "R1/2" in the output terminal of the ramp signal VRAMP. The fourth resistance value reflection unit may reflect, based on the fourth gain assignment signal GC<4>, a resistance value corresponding to "R1/4" in the output terminal of the ramp signal VRAMP. Here, the first resistance value may be defined by at least one of the first to fourth resistance value reflection units.

The slope correction circuit 200 may include first to fifth resistance value correction units. The first to fifth resistance value correction units may reflect the second resistance value in the output terminal of the ramp signal VRAMP based on first to fifth correction assignment signals CC<1> to CC<5> included in the correction code signal CC<1:5>. For instance, the first resistance value correction unit may reflect, based on the first correction assignment signal CC<1>, a resistance value corresponding to "128*R1" in the output terminal of the ramp signal VRAMP. The second resistance value correction unit may reflect, based on the second correction assignment signal CC<2>, a resistance value corresponding to "64*R1" in the output terminal of the ramp signal VRAMP. The third resistance value correction unit may reflect, based on the third correction assignment signal CC<3>, a resistance value corresponding to "32*R1" in the output terminal of the ramp signal VRAMP. The fourth resistance value correction unit may reflect, based on the fourth correction assignment signal CC<4>, a resistance value corresponding to "16*R1" to the output terminal of the ramp signal VRAMP. The fifth resistance value correction unit may reflect, based on the fifth correction assignment signal CC<5>, a resistance value corresponding to "8*R1" in the output terminal of the ramp signal VRAMP. Here, the second resistance value may be defined by at least one of the first to fifth resistance value correction units.

The parasitic resistance PR may undesirably reflect a resistance value corresponding to "R1/512" in the output terminal of the ramp signal VRAMP.

Hereinafter, the operation of the electronic device will be described on the assumption that the slope adjustment circuit 120, the slope correction circuit 200 and the parasitic resistance PR are designed or formed in the manner shown in FIG. 3.

The ramp signal generator 100 may generate the ramp signal VRAMP based on the ramp code signal RC<1:A>. In addition, the ramp signal generator 100 may adjust the slope of the ramp signal VRAMP based on the gain code signal GC<1:4>. For example, the slope adjustment circuit 120 may adjust the slope of the ramp signal VRAMP by adjusting the first resistance value to be reflected in the output terminal of the ramp signal VRAMP. The ramp signal VRAMP should be adjusted to have a first slope corresponding to a desired analog gain. However, because of parasitic resistance PR the ramp signal VRAMP may have a second slope which is different from the first slope. For example, the ramp signal VRAMP may have a second slope which is smaller than the first slope because of the parasitic resistance PR having a positive resistance value.

The slope correction circuit 200 may correct the slope of the ramp signal VRAMP based on the correction code signal CC<1:5>. For instance, the first to fifth resistance value correction units included in the slope correction circuit 200 may correct the slope of the ramp signal VRAMP by adjusting the second resistance value to be reflected in the output terminal of the ramp signal VRAMP in response to the correction code signal CC<1:5>.

For example, in the case where correction is needed as described above, gain and correction code signals according to the analog gain may be generated as shown in the following table 1.

TABLE 1

| Analog gain | GC<4> | GC<3> | GC<2> | GC<1> | CC<5> | CC<4> | CC<3> | CC<2> | CC<1> |
|---|---|---|---|---|---|---|---|---|---|
| 1 | 0 | 0 | 0 | 1 | 0 | 0 | 0 | 0 | 0 |
| 2 | 0 | 0 | 1 | 1 | 0 | 0 | 0 | 0 | 1 |
| 4 | 0 | 1 | 1 | 1 | 0 | 0 | 1 | 1 | 0 |
| 8 | 1 | 1 | 1 | 1 | 1 | 1 | 1 | 0 | 1 |

For reference, as shown Table 1, all of the first to fifth correction assignment signals CC<1:5> may be disabled in the case where the analog gain is '1'. The reason for this is because a difference between the first slope and the second slope is within an allowable range.

Figure 4:
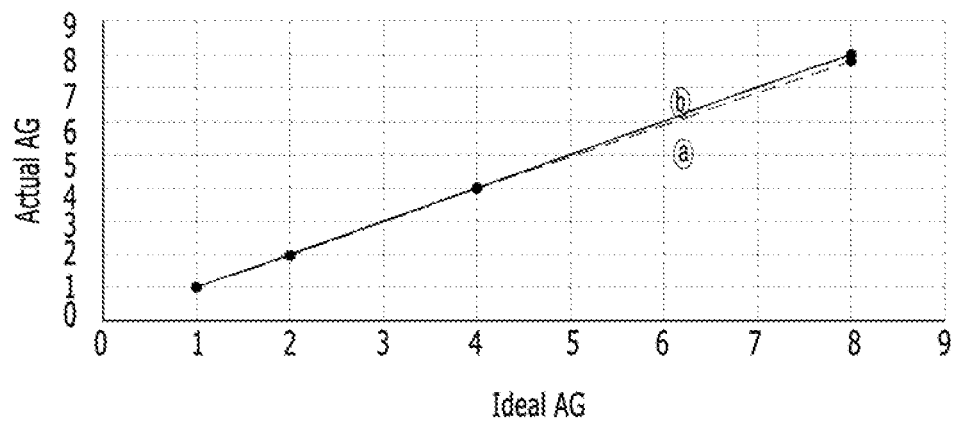
FIGS. 4 and 5 are graphs illustrating examples of performance of an electronic device, in accordance with an embodiment of the present disclosure.
Figure 5:
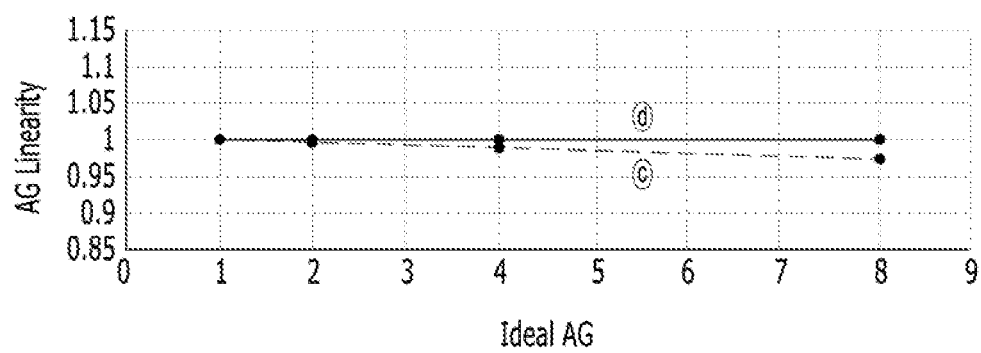

FIGS. 4 and 5 are graphs illustrating examples of performance of an electronic device in accordance with an embodiment of the present disclosure. For example, in FIGS. 4 and 5, there are illustrated graphs illustrating an enhanced performance of the electronic device shown in FIGS. 1 to 3.

FIG. 4 is a graph showing an actual analog gain (actual AG) according to an ideal analog gain (ideal AG), and FIG. 5 is a graph showing analog gain linearity (AG linearity) according to the ideal analog gain.

In the case where the first resistance value that is reflected in the ramp signal VRAMP is reduced by the parasitic resistance PR, the slope of the ramp signal VRAMP may be reduced. Therefore, as shown in FIG. 4, the actual analog gain may be decreased compared to the ideal analog gain (refer to ⓐ).

In the case where the first resistance value is undesirably reduced, the slope of the ramp signal VRAMP may be increased by reflecting the second resistance value in the output terminal of the ramp signal VRAMP. As a result, the actual analog gain may be increased to get closer to the ideal analog gain (refer to ⓑ). Here, the actual analog gain may be defined by the following equation 1.

$$\text{actual } AG = \frac{R_{AG=l}}{R_{AG=k}} = \frac{S_{AG=l}}{S_{AG=k}} \quad (1)$$

The term "$R_{AG=k}$" refers to a resistance value reflected in the output terminal of the ramp signal VRAMP when the actual analog gain is k (where k is 1, 2, 4, or 8). The term "$R_{AG=1}$" refers to a resistance value reflected to the output terminal of the ramp signal VRAMP when the actual analog gain is 1. The term "$S_{AG=k}$" refers to a slope of the ramp signal VRAMP when the actual analog gain is k. The term "$S_{AG=1}$" refers to a slope of the ramp signal VRAMP when the actual analog gain is 1.

In the case where the actual analog gain is lowered compared to the ideal analog gain (refer to ⓐ), as shown in FIG. 5, the analog gain linearity according to the ideal analog gain may be lowered (refer to ⓒ). In addition, as the actual analog gain is increased to an approximation of the ideal analog gain (refer to ⓑ), the analog gain linearity according to the ideal analog gain may be increased to a normal value (refer to ⓓ). Here, the analog gain linearity may be defined by the following equation 2.

$$AG \text{ linearity} = \frac{\text{actual } AG_{AG=k}}{\text{actual } AG_{AG=l}} \quad (2)$$

There will be described the operation of the electronic device in the case where the parasitic resistance PR has a negative resistance value. Here, there will be described an example in which the slope adjustment circuit 120, the slope correction circuit 200 and the parasitic resistance PR included in the electronic device are designed or formed in a manner shown in FIG. 6.

Figure 6:
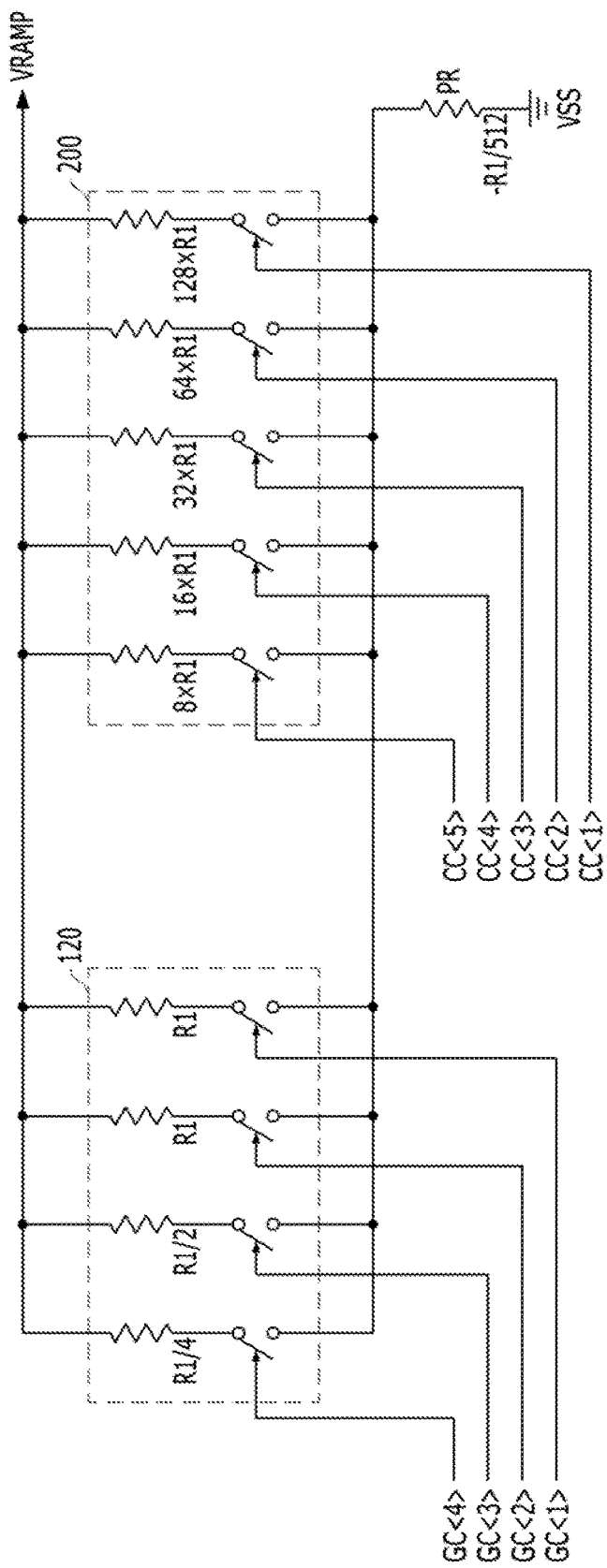
FIG. 6 is a circuit diagram illustrating a slope adjustment circuit, a slope correction circuit and a parasitic resistance shown in FIG. 2.

FIG. 6 is a circuit diagram illustrating a slope adjustment circuit, a slope correction circuit and a parasitic resistance in accordance with an embodiment of the present disclosure. For example, in FIG. 6, there is illustrated a circuit diagram showing an embodiment of the slope adjustment circuit 120, the slope correction circuit 200 and the parasitic resistance PR shown in FIG. 2.

The slope adjustment circuit 120 and the slope correction circuit 200 have the same configurations as those of FIG. 3, and therefore, detailed explanation thereof will be omitted.

The parasitic resistance PR may undesirably reflect a resistance value corresponding to "−R1/512" in the output terminal of the ramp signal VRAMP. Here, we note that it is physically impossible for the parasitic resistance PR to have a negative resistance value. Therefore, in an embodiment, the parasitic resistance PR may be a parasitic resistance simulated to correspond to the case where it has a negative resistance value.

Hereinafter, the operation of the electronic device will be described on the assumption that the slope adjustment circuit 120, the slope correction circuit 200 and the parasitic resistance PR are designed or formed in the manner shown in FIG. 6.

The ramp signal generator 100 may generate the ramp signal VRAMP based on the ramp code signal RC<1:A>. In addition, the ramp signal generator 100 may adjust the slope of the ramp signal VRAMP based on the gain code signal GC<1:4>. For example, the slope adjustment circuit 120 may adjust the slope of the ramp signal VRAMP by adjusting the first resistance value to be reflected in the output terminal of the ramp signal VRAMP. Here, the ramp signal VRAMP should be adjusted to have a first slope corresponding to an analog gain. However, the ramp signal VRAMP may have a third slope different from the first slope because of a parasitic resistance PR. For example, the ramp signal VRAMP may have the third slope greater than the first slope because of the parasitic resistance PR having a negative resistance value.

The slope correction circuit 200 may correct the slope of the ramp signal VRAMP based on a correction code signal CC<1:5>. For instance, the first to fifth resistance value correction units included in the slope correction circuit 200 may correct the slope of the ramp signal VRAMP by adjusting the second resistance value to be reflected in the output terminal of the ramp signal VRAMP.

For example, in the case where correction is needed as described above, code signals according to the analog gain may be generated as shown in the following table 2.

TABLE 2

| Analog gain | GC<4> | GC<3> | GC<2> | GC<1> | CC<5> | CC<4> | CC<3> | CC<2> | CC<1> |
|---|---|---|---|---|---|---|---|---|---|
| 1 | 0 | 0 | 0 | 1 | 0 | 0 | 1 | 0 | 0 |
| 2 | 0 | 0 | 1 | 1 | 0 | 0 | 1 | 1 | 1 |
| 4 | 0 | 1 | 1 | 1 | 0 | 1 | 0 | 1 | 0 |
| 8 | 1 | 1 | 1 | 1 | 0 | 0 | 1 | 0 | 0 |

Figure 7:
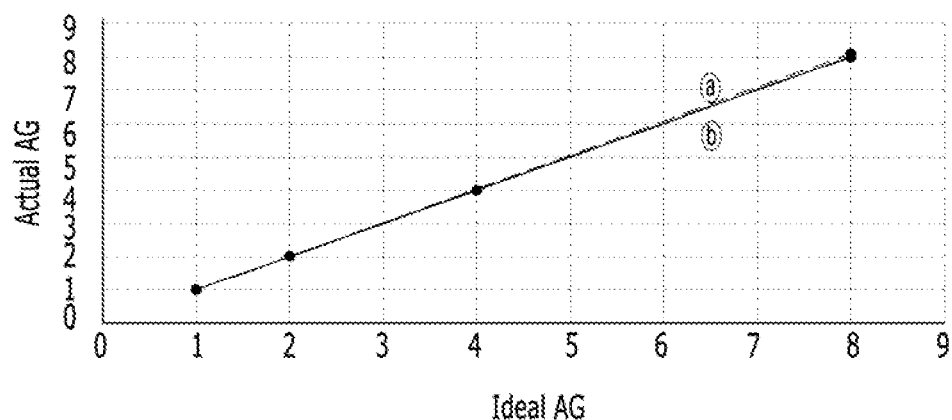
FIGS. 7 and 8 are graphs illustrating examples of performance of an electronic device in accordance with an embodiment of the present disclosure.
Figure 8:
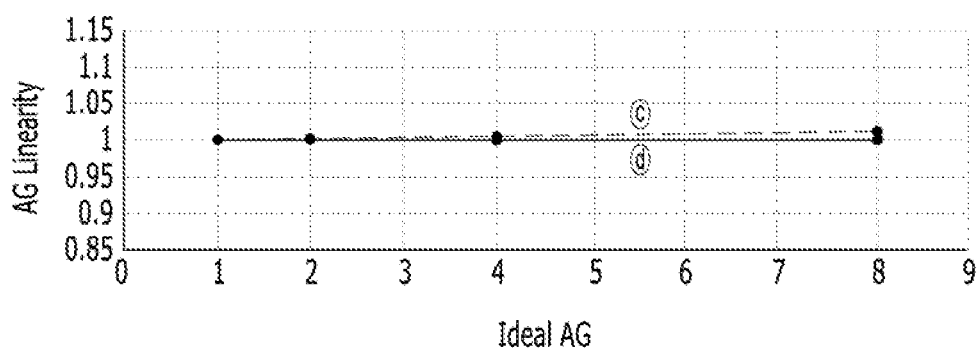

FIGS. 7 and 8 are graphs illustrating examples of performance of an electronic device in accordance with an embodiment of the present disclosure. For example, in FIGS. 7 and 8, there are illustrated graphs for describing enhanced performance of the electronic device shown in FIGS. 1, 2 and 6.

FIG. 7 is a graph showing an actual analog gain (actual AG) according to an ideal analog gain (ideal AG), and FIG. 8 is a graph showing analog gain linearity (AG linearity) according to the ideal analog gain.

In the case where the first resistance value is increased by the parasitic resistance PR, the slope of the ramp signal VRAMP may increase. As a result, as shown in FIG. 7, the actual analog gain may be increased compared to the ideal analog gain (refer to (a)).

In the case where the first resistance value is undesirably increased, the slope of the ramp signal VRAMP may be decreased by reflecting the second resistance value in the output terminal of the ramp signal VRAMP. As a result, the actual analog gain may be decreased to get closer to the ideal analog gain (refer to (b)).

In the case where the actual analog gain is raised compared to the ideal analog gain (refer to (a)), as shown in FIG. 8, the analog gain linearity according to the ideal analog gain may be increased (refer to (c)). In this case, as the actual analog gain is lowered to an approximation of the ideal analog gain (refer to (b)), the analog gain linearity according to the ideal analog gain may also be lowered to a normal value (refer to (d)).

Figure 9:
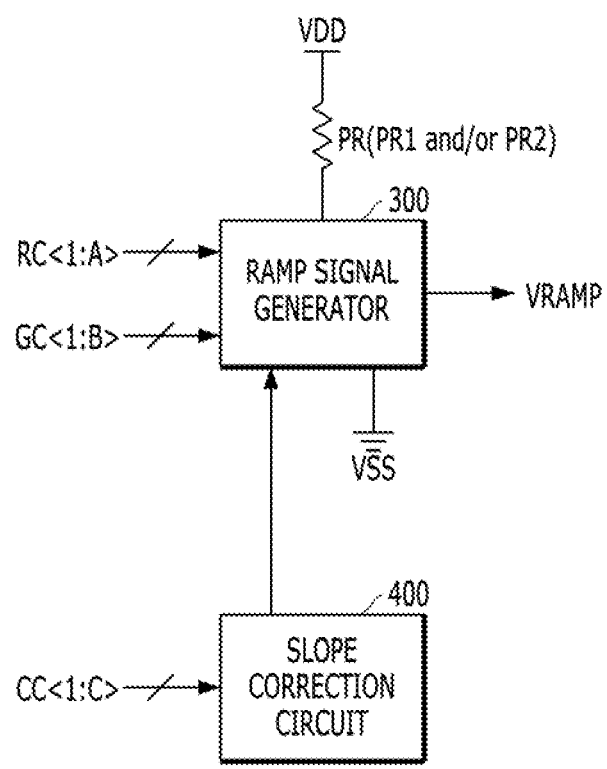
FIG. 9 is a block diagram illustrating an electronic device, in accordance with an embodiment of the present disclosure.

FIG. 9 is a block diagram illustrating an electronic device in accordance with an embodiment of the present disclosure.

Referring to FIG. 9, the electronic device may include a ramp signal generator 300 and a slope correction circuit 400.

The ramp signal generator 300 may generate a ramp signal VRAMP having a slope corresponding to an analog gain based on a ramp code signal RC<1:A> and a gain code signal GC<1:B>. For instance, the ramp signal generator 300 may generate a ramp signal VRAMP, which is decreasing by a voltage level corresponding to the analog gain per unit time.

The ramp signal generator 300 may adjust the slope of the ramp signal VRAMP based on a variable current. For example, the ramp signal generator 300 may adjust the slope of the ramp signal VRAMP by adjusting the voltage level of a bias signal VB—a signal needed when the ramp signal VRAMP is generated—according to the analog gain. This will be described in more detail later herein (refer to FIG. 10).

The ramp signal generator 300 may undesirably adjust the slope of the ramp signal VRAMP because of an external change or an internal change. For instance, the ramp signal generator 300 may be coupled between a high-voltage terminal VDD and a low-voltage terminal VSS, and undesirably increase or decrease the slope of the ramp signal VRAMP because of a parasitic resistance PR generated between the ramp signal generator 300 and the high voltage terminal VDD. Here, the parasitic resistance PR may refer to a parasitic resistance which is substantially generated between the ramp signal generator 300 and the high-voltage terminal VDD. Alternatively, the parasitic resistance PR may refer to a parasitic resistance which is simulated as being generated between the ramp signal generator 300 and the high-voltage terminal VDD. The parasitic resistance PR may include a first parasitic PR1 and/or a second parasitic PR2, and this will be described later herein (refer to FIG. 10). The words "the slope of the ramp signal VRAMP has been undesirably adjusted" means that the analog gain has been undesirably adjusted.

The slope correction circuit 400 may correct the slope of the ramp signal VRAMP based on a correction code signal CC<1:C>. For example, the slope correction circuit 400 may indirectly increase or decrease, based on the correction code signal CC<1:C>, the slope of the ramp signal VRAMP that has been undesirably adjusted by the parasitic resistance PR.

The slope correction circuit 400 may correct the slope of the ramp signal VRAMP based on the variable current. For example, the slope correction circuit 400 may correct the slope of the ramp signal VRAMP by correcting the voltage level of the bias signal VB according to the parasitic resistance PR. This will be described in detail later herein (refer to FIG. 10).

Figure 10:
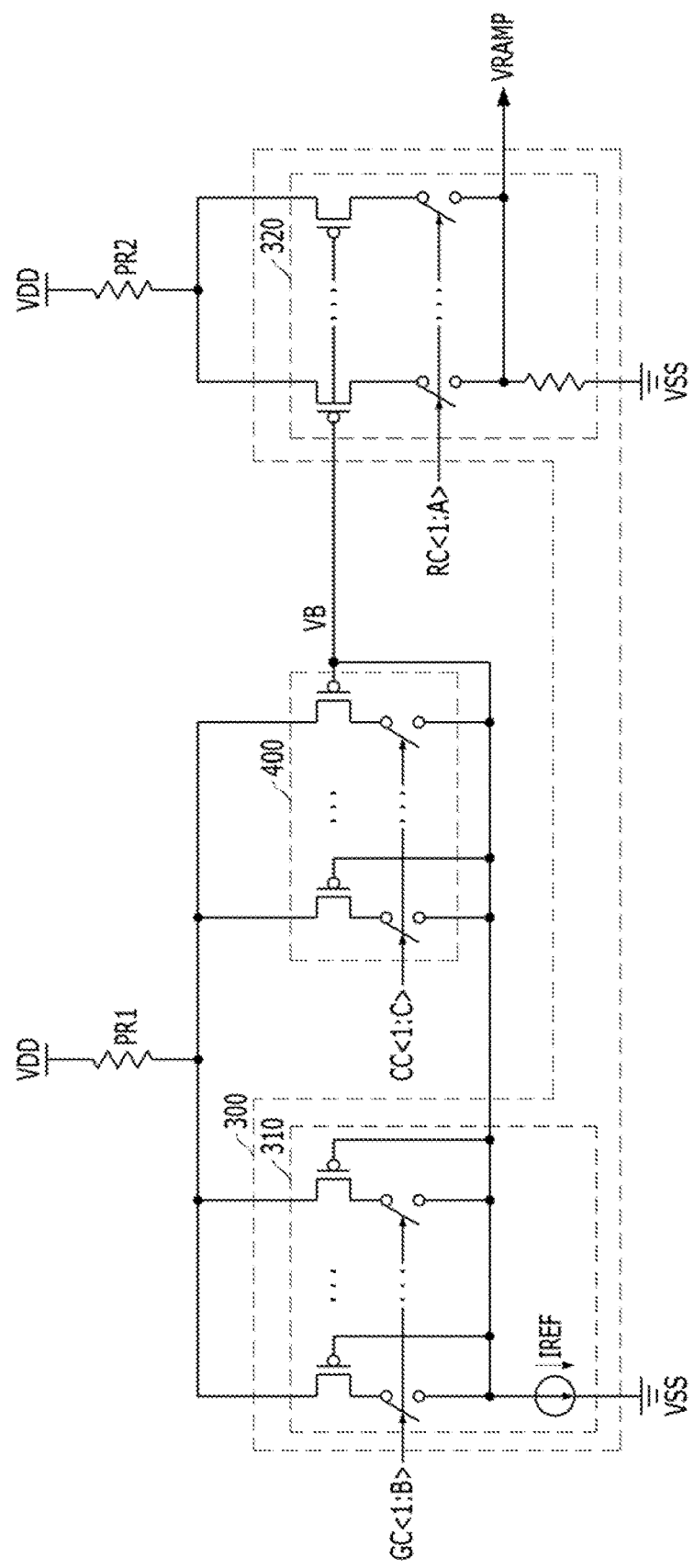
FIG. 10 is a diagram illustrating a ramp signal generator and a slope correction circuit shown in FIG. 9.

FIG. 10 is a diagram illustrating a ramp signal generator and a slope correction circuit in accordance with an embodiment of the present disclosure. For example, in FIG. 10, there is illustrated a circuit diagram of the ramp signal generator 300 and the slope correction circuit 400 shown in FIG. 9.

Referring to FIG. 10, the ramp signal generator 300 may include a variable-current-based bias signal generation circuit 310, and a fixed-resistance-based ramp signal generation circuit 320.

The bias signal generation circuit 310 may generate a bias signal VB corresponding to the analog gain based on a gain code signal GC<1:B>. For instance, the bias signal generation circuit 310 may include a reference current generation unit, and a plurality of bias current generation units. The reference current generation unit may be coupled between the output terminal of the bias signal VB and the low-voltage terminal VSS, and generate a reference current IREF. The plurality of bias current generation units may be coupled in parallel between the high-voltage terminal VDD and the output terminal of the bias signal VDD, and generate, based on the gain code signal GC<1:B>, a bias current corresponding to the analog gain on the output terminal of the bias signal VB.

The bias signal generation circuit 310 may be coupled between the high-voltage terminal VDD and the low-voltage terminal VSS. The first parasitic resistance PR1 may be formed between the bias signal generation circuit 310 and the high-voltage terminal VDD. In this case, the bias signal generation circuit 310 may generate a bias signal VB which has been undesirably adjusted in voltage level by the first parasitic resistance PR1.

The ramp signal generation circuit 320 may include a fixed resistance unit, and a plurality of ramp current generation units. The fixed resistance unit may be coupled between the output terminal of the ramp signal VRAMP and the low-voltage terminal VSS, and have a fixed resistance value. The plurality of ramp current generation units may be coupled in parallel between the high-voltage terminal VDD and the output of the ramp signal VRAMP, and generate, based on the bias signal VB and the ramp code signal RC<1:A>, a ramp current which is adjusted by a predetermined level per unit time on the output terminal of the ramp signal VRAMP.

In the case where the voltage level of the bias signal VB is undesirably adjusted by the first parasitic resistance PR1, the ramp signal generation circuit 320 may generate a ramp signal VRAMP which has been undesirably adjusted in slope.

In addition, the ramp signal generation circuit 320 may be coupled between the high-voltage terminal VDD and the low-voltage terminal VSS. The second parasitic resistance PR2 may be formed between the ramp signal generation circuit 320 and the high-voltage terminal VDD. In this case, the ramp signal generation circuit 320 may generate a ramp signal VRAMP which has been undesirably adjusted in slope by the second parasitic resistance PR2.

The slope correction circuit 400 may be coupled between the high-voltage terminal VDD and the output terminal of the bias signal VB, and correct the slope of the ramp signal VRAMP which has been undesirably adjusted by at least one of the first parasitic resistance PR1 and the second parasitic resistance PR2. For example, the slope correction circuit 400 may decrease the slope of the ramp signal VRAMP when at least one of the first parasitic resistance PR1 and the second parasitic resistance PR2 has a positive value. Alternatively, the slope correction circuit 400 may increase the slope of the ramp signal VRAMP when at least one of the first parasitic resistance PR1 and the second parasitic resistance PR2 has a negative value.

For example, the slope correction circuit 400 may include a plurality of correction current generation units. The plurality of correction current generation units may be coupled in parallel between the high-voltage terminal VDD and the output terminal of the bias signal VB, and generate, based on the correction code signal CC<1:C>, a correction current corresponding to at least one of the first parasitic resistance PR1 and the second parasitic resistance PR2 on the output terminal of the bias signal VB.

The operation of the electronic device in accordance with the embodiment having the above-mentioned configuration as shown in FIGS. 9 and 10 is analogous to the operation of the electronic device in accordance with the embodiment as shown in FIGS. 1 to 8. Therefore, description of the operation of the electronic device of the embodiment of FIGS. 9 and 10 is omitted.

In accordance with embodiments of the present disclosure, as described above, the electronic device is advantageous in that it is capable of correcting nonlinearity of an analog gain which is caused by process variation of a circuit which directly or indirectly pertains to the generation of a ramp signal.

In an embodiment of the present disclosure, when the slope of a ramp signal is adjusted depending on an analog gain, the linearity of the analog gain may be maintained substantially constant. Therefore, the operational reliability of an electronic device may be improved.

Although specific embodiments have been described for illustrative purposes, it will be apparent to those skilled in the art that various other changes and modifications may be made without departing from the spirit and scope of the disclosure as defined in the following claims.

What is claimed is:

1. An electronic device comprising:
   a ramp signal generator suitable for generating a ramp signal having a slope corresponding to an analog gain; and
   a slope correction circuit suitable for correcting the slope based on a correction code signal,
   wherein the ramp signal generator is coupled between a first voltage terminal and a second voltage terminal, and
   wherein the slope correction circuit is coupled to an output terminal of the ramp signal and corrects the slope changed by a parasitic resistance formed between the ramp signal generator and the first voltage terminal, or is coupled to the ramp signal generator and corrects the slope changed by a parasitic resistance formed between the ramp signal generator and the second voltage terminal.

2. The electronic device of claim 1, wherein the correction code signal presets corresponding to the analog gain.

3. The electronic device of claim 1, wherein the ramp signal generator adjusts the slope according to the analog gain based on a ramp code signal and a gain code signal.

4. The electronic device of claim 3,
wherein the ramp signal generator adjusts the slope by adjusting a resistance value to be reflected in an output terminal of the ramp signal, and
wherein the slope correction circuit corrects the slope by reflecting a predetermined resistance value in the output terminal of the ramp signal.

5. The electronic device of claim 3,
wherein the ramp signal generator adjusts the slope by adjusting a voltage level of a bias signal needed when the ramp signal is generated, and
wherein the slope correction circuit corrects the slope by generating a correction current on an output terminal of the bias signal.

6. An electronic device comprising:
a ramp current generation circuit suitable for generating a ramp current corresponding to a ramp signal on an output terminal of the ramp signal;
a slope adjustment circuit suitable for adjusting a slope of the ramp signal according to an analog gain; and
a slope correction circuit suitable for correcting the slope of the ramp signal based on a correction code signal,
wherein the slope adjustment circuit is coupled between the output terminal of the ramp signal and a low-voltage terminal,
wherein the slope correction circuit corrects the slope of the ramp signal changed by a parasitic resistance formed between the slope adjustment circuit and the low-voltage terminal,
wherein the slope correction circuit includes a plurality of resistance value reflection units coupled in parallel between the output terminal of the ramp signal and the low-voltage terminal, and
wherein the plurality of resistance value reflection units reflect a resistance value corresponding to the parasitic resistance in the output terminal of the ramp signal, based on the correction code signal.

7. The electronic device of claim 6, wherein the slope correction circuit reduces the slope when the parasitic resistance has a positive value, and increases the slope when the parasitic resistance has a negative value.

8. The electronic device of claim 6, wherein the correction code signal presets corresponding to the analog gain.

9. The electronic device of claim 6, wherein the ramp current generation circuit comprises:
a bias signal generation unit coupled between a high-voltage terminal and a low-voltage terminal, and configured to generate a bias signal corresponding to a reference current; and
a plurality of mirroring units coupled in parallel between the high-voltage terminal and the output terminal of the ramp signal, and configured to generate the ramp current by mirroring the reference current, based on the bias signal and a ramp code signal.

10. The electronic device of claim 6,
wherein the slope adjustment circuit comprises a plurality of resistance value reflection units coupled in parallel between the output terminal of the ramp signal and a low-voltage terminal, and
wherein the plurality of resistance value reflection units reflect a resistance value corresponding to the analog gain in the output terminal of the ramp signal, based on a gain code signal.

11. An electronic device comprising:
a bias signal generation circuit suitable for generating a bias signal corresponding to an analog gain;
a ramp signal generation circuit suitable for generating a ramp signal, and adjusting a slope of the ramp signal based on the bias signal; and
a slope correction circuit suitable for correcting the slope of the ramp signal based on a correction code signal,
wherein each of the bias signal generation circuit and the ramp signal generation circuit is coupled between a high-voltage terminal and a low-voltage terminal,
wherein the slope correction circuit corrects, based on a correction code signal, the slope of the ramp signal changed by at least one of a first parasitic resistance and a second parasitic resistance, and
wherein the first parasitic resistance is formed between the high-voltage terminal and the bias signal generation circuit, and the second parasitic resistance is formed between the high-voltage terminal and the ramp signal generation circuit.

12. The electronic device of claim 11, wherein the slope correction circuit reduces the slope when at least one of the first parasitic resistance and the second parasitic resistance has a positive value, and increases the slope when at least one of the first parasitic resistance and the second parasitic resistance has a negative value.

13. The electronic device of claim 11, wherein the correction code signal presets corresponding to the analog gain.

14. The electronic device of claim 11,
Wherein the slope correction circuit comprises a plurality of correction current generation units coupled in parallel between the high-voltage terminal and an output terminal of the bias signal, and
wherein the plurality of correction current generation units generate a correction current corresponding to at least one of the first parasitic resistance and the second parasitic resistance on the output terminal of the bias signal, based on the correction code signal.

15. The electronic device of claim 11, wherein the bias signal generation circuit comprises:
a reference current generation unit coupled between an output terminal of the bias signal and a low-voltage terminal; and
a plurality of bias signal generation units coupled in parallel between a high-voltage terminal and the output terminal of the bias signal, and
wherein the plurality of bias signal generation units generate a bias current corresponding to the analog gain on the output terminal of the bias signal, based on the gain code signal.

16. The electronic device of claim 11, wherein the ramp signal generation circuit comprises:
a fixed resistance unit coupled between an output terminal of the ramp signal and a low-voltage terminal; and
a plurality of ramp current generation units coupled in parallel between a high-voltage terminal and the output terminal of the ramp signal, and
wherein the plurality of ramp current generation units generate a ramp current on the output terminal of the ramp signal, based on the bias signal and a ramp code signal, the ramp current being adjusted by a predetermined level per unit time.

* * * * *